(12) United States Patent
Burr

(10) Patent No.: US 6,472,919 B1
(45) Date of Patent: Oct. 29, 2002

(54) LOW VOLTAGE LATCH WITH UNIFORM STACK HEIGHT

(75) Inventor: James B. Burr, Foster City, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/872,787

(22) Filed: Jun. 1, 2001

(51) Int. Cl.⁷ .............................................. H03K 3/356
(52) U.S. Cl. ....................... 327/210; 327/211; 327/212; 327/208
(58) Field of Search ................................. 327/202, 203, 327/208, 210, 211–215, 217, 218, 219

(56) References Cited

U.S. PATENT DOCUMENTS

| | | | |
|---|---|---|---|
| 4,365,172 A | 12/1982 | Prater | 307/270 |
| 4,700,212 A | 10/1987 | Okazawa | 357/41 |
| 5,362,981 A | 11/1994 | Sato et al. | 257/371 |
| 5,471,421 A | 11/1995 | Rose et al. | 365/182 |
| 5,566,120 A | 10/1996 | D'Souza | 365/227 |
| 5,581,500 A | 12/1996 | D'Souza | 365/154 |
| 5,594,371 A | 1/1997 | Douseki | 326/119 |
| 5,598,114 A | 1/1997 | Jasshidi | 326/113 |
| 5,606,270 A | 2/1997 | D'Souza et al. | 326/98 |
| 5,612,645 A | 3/1997 | Halepete | 327/537 |
| 5,622,880 A | 4/1997 | Burr et al. | 438/194 |
| 5,640,115 A | 6/1997 | Halepete | 327/219 |
| 5,650,340 A | 7/1997 | Burr et al. | 437/30 |
| 5,663,669 A * | 9/1997 | Vanderschaaf | 327/202 |
| 5,675,172 A | 10/1997 | Miyamoto et al. | 257/402 |
| 5,719,422 A | 2/1998 | Burr et al. | 257/336 |
| 5,726,477 A | 3/1998 | Williams et al. | 257/402 |
| 5,751,170 A | 5/1998 | Pyeon | 327/57 |
| 5,753,958 A | 5/1998 | Burr et al. | 257/392 |
| 5,760,607 A | 6/1998 | Leeds et al. | 326/38 |
| 5,773,863 A | 6/1998 | Burr et al. | 257/344 |
| 5,780,912 A | 7/1998 | Burr et al. | 257/408 |
| 5,783,958 A | 7/1998 | Lysinger | 327/202 |
| 5,811,871 A | 9/1998 | Nakashima | 257/565 |
| 5,812,002 A * | 9/1998 | Yoshida | 327/210 |
| 5,916,237 A | 6/1999 | Schu | 607/2 |
| 5,923,987 A | 7/1999 | Burr | 438/304 |
| 5,942,781 A | 8/1999 | Burr et al. | 257/347 |
| 5,982,211 A | 11/1999 | Ko | 327/202 |
| 5,985,705 A | 11/1999 | Seliskar | 438/197 |
| 5,985,727 A | 11/1999 | Burr | 438/302 |
| 5,998,850 A | 12/1999 | Burr | 257/428 |
| 6,031,778 A | 2/2000 | Makino et al. | 365/226 |
| 6,048,746 A | 4/2000 | Burr | 438/17 |
| 6,072,217 A | 6/2000 | Burr | 257/351 |
| 6,087,892 A | 7/2000 | Burr | 327/534 |
| 6,091,283 A | 7/2000 | Murgula et al. | 327/537 |
| 6,093,951 A | 7/2000 | Burr | 257/408 |
| 6,100,567 A | 8/2000 | Burr | 257/365 |
| 6,110,783 A | 8/2000 | Burr | 438/286 |
| 6,118,328 A | 9/2000 | Morikawa | 327/534 |
| 6,121,666 A | 9/2000 | Burr | 257/408 |
| 6,130,550 A | 10/2000 | Zaliznyak | 326/39 |
| 6,133,762 A | 10/2000 | Hill et al. | 326/119 |
| 6,137,142 A | 10/2000 | Burr | 257/349 |
| 6,144,079 A | 11/2000 | Shirahata et al. | 257/392 |
| 6,157,213 A | 12/2000 | Voogel | 326/41 |
| 6,190,954 B1 | 2/2001 | Lee et al. | 438/199 |
| 6,211,725 B1 | 4/2001 | Kang | 327/534 |
| 6,231,147 B1 | 5/2001 | Bosshart | 327/212 |
| 6,255,853 B1 | 7/2001 | Houston | 326/98 |
| 6,310,487 B1 | 10/2001 | Yokomizo | 324/769 |
| 6,329,874 B1 | 12/2001 | Ye et al. | 327/544 |
| 6,337,583 B1 | 1/2002 | Ooishi et al. | 326/119 |

* cited by examiner

Primary Examiner—Terry D. Cunningham
Assistant Examiner—Long Nguyen
(74) Attorney, Agent, or Firm—Gunnison, McKay & Hodgson, L.L.P.; Philip J. McKay

(57) ABSTRACT

Low voltage latches are designed such that all the transistors included in the latch are low threshold transistors and voltage scalability of the latches of the invention is further increased by designing latches with uniform stack height components. One embodiment of the invention allows for minimum supply voltages of 60 millivolts, an improvement of over thirteen hundred percent compared with the typical prior art minimum voltage requirement of 800 millivolts.

8 Claims, 7 Drawing Sheets

LOW VOLTAGE LATCH WITH UNIFORM STACK HEIGHT

FIELD OF THE INVENTION

The present invention relates generally to transistor devices and, more particularly, to low voltage and ultra-low voltage latches.

BACKGROUND OF THE INVENTION

In modern computer systems, power density and scalability issues represent some of the most significant obstacles to increased system performance. For reliability, the supply voltage Vdd must come down. In addition, to control leakage current, the threshold voltage must come up. Consequently, performance is being rapidly squeezed between the two. In addition, with the emergence of an electronics market that stresses portability, compact size, lightweight and the capability for prolonged remote operation, a demand has arisen for low power and ultra-low power transistor devices and systems.

One of the most important transistor devices in any system is the data latch, also called simply a "latch". However, in the prior art, latches have represented a significant challenge to the designer seeking to reduce power consumption and increase system performance for a given supply voltage. Latches have proven a particularly difficult problem in the low voltage and ultra-low power regimes.

One reason prior art latches have been such a problem is that standard CMOS technology was used to make the transistors in prior art latches. This resulted in transistors with threshold voltages of 500 millivolts. The fact that prior art latches included transistors with threshold voltages this high meant that the ability of prior art latches to operate at lower supply voltages was significantly limited. Indeed, prior art latches typically had to operate at relatively high minimum supply voltages of 800 millivolts or more in order to achieve reasonable performance. Consequently, the voltage scalability of prior art latches, i.e., the ability of prior art latches to operate over a wide range of supply voltages, was very limited. As a result, the performance of prior art latches was far from ideal.

What is needed is a latch that can operate at very low supply voltages and therefore has increased voltage scalability and the potential for better performance and lower power consumption.

SUMMARY OF THE INVENTION

According to one embodiment of the invention, latch components are comprised of low threshold transistors. In addition, according to one embodiment of the invention, to overcome leakage current and ensure proper latch operation, the channel widths of the low threshold transistors making up the feedback components of the latch are larger than the channel widths of the low threshold transistors making up the storage components of the latch. This embodiment of the invention allows for minimum supply voltages of 120 millivolts; an improvement of over six hundred percent compared with the typical prior art minimum voltage requirement of 800 millivolts.

In another embodiment of the present invention, a method and structure for providing low voltage latches includes using low threshold transistors having consistent channel dimensions and the use of multi-inverter feedback structures. In this embodiment of the invention, all the transistors included in a latch have the same channel dimensions, i.e., the same channel length and width. In order to meet this requirement and still provide a feedback signal of sufficient strength to overcome leakage effects and ensure proper latch operation, latches according to this embodiment of the invention include feedback stages with multiple inverters. By using transistors of the same channel length and width in the latches of the invention, the voltage scalability of the latch is increased significantly over that of prior art latches. This embodiment of the invention allows for minimum supply voltages of 85 millivolts; an improvement of over nine hundred percent compared with the typical prior art minimum voltage requirement of 800 millivolts.

In addition to ensuring all of the transistors making up a latch have the same channel dimensions, according to the invention, the minimum voltage requirement of the latch is further reduced by designing the latch with uniform stack height components, i.e., components with equal numbers of transistors in series. This technique is in sharp contrast to the prior art teachings. A particularly significant increase in latch performance is obtained when the latch is designed to include both uniform stack height and transistors of uniform channel dimensions in accordance with the invention. This embodiment of the invention allows for minimum supply voltages of 60 millivolts; an improvement of over thirteen hundred percent compared with the typical prior art minimum voltage requirement of 800 millivolts.

As a result of these and other features discussed in more detail below, latches designed according to the principles of the present invention require significantly lower supply voltages and have significantly improved voltage scalability and performance compared to prior art latches. Consequently, latches designed according to the principles of the invention can better meet the needs of modern electronics markets than prior art methods or structures.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same or similar reference numbers may be used throughout the drawings and the following description to refer to the same or like parts.

According to one embodiment of the invention (100 in FIG. 1A), and in contrast to the structures and teachings of the prior art, latch components (101, 103, 107, and 109) are comprised of low threshold transistors and the channel widths (153 in FIGS. 1B and 1C) of the low threshold transistors making up the feedback components (109 in FIG. 1A) of the latch are larger than the channel widths of the low threshold transistors making up the storage components (101 and 107 in FIG. 1A) of the latch. This embodiment of the invention allows for minimum supply voltages of 120 millivolts; an improvement of over six hundred percent compared with the typical prior art minimum voltage requirement of 800millivolts.

Figure 2A:
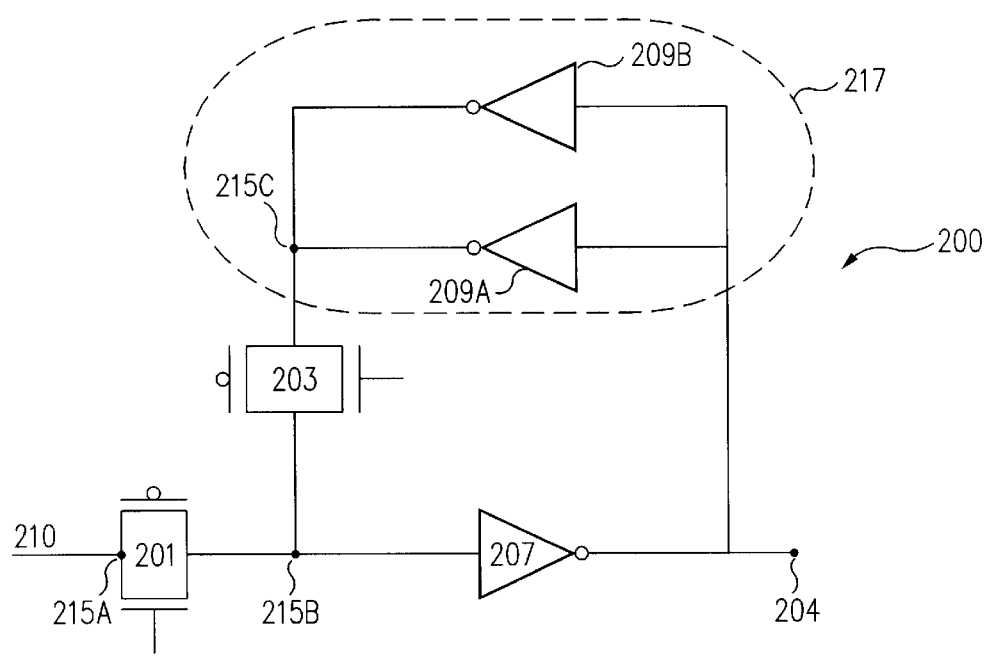
FIG. 2A is a schematic representation of another embodiment of a latch circuit in accordance with the principles of the present invention.

In another embodiment of the present invention, a method and structure for providing low voltage latches (200 in FIG. 2A) includes low threshold transistors having consistent channel dimensions and the use of multi-inverter feedback stages (217 in FIG. 2A). In this embodiment of the invention, all the transistors included in a latch have the same channel dimensions, i.e., the same channel length and width. In order to meet this requirement, and still provide a feedback signal of sufficient strength, latches according to this embodiment of the invention include feedback stages with multiple inverters (209A and 209B in FIG. 2A). By using only transistors of the same channel length and width in the latches of this embodiment of the invention, the voltage scalability of the latch is increased significantly over that of prior art latches. This embodiment of the invention allows for minimum supply voltages of 85 millivolts; an improvement of over nine hundred percent compared with the typical prior art minimum voltage requirement of 800 millivolts.

In addition to ensuring all of the transistors making up a latch have the same channel dimensions, according to the invention, the minimum voltage requirement of the latch is further reduced by designing the latch (500 in FIG. 5A and 500A in FIG. 5B) with uniform transistor stack height components (503 and 509 in FIG. 5A and 503, 509A and 509C in FIG. 5B), i.e., with equal numbers of transistors in series. This technique is in sharp contrast to the prior art teachings. A particularly significant increase in latch performance is obtained when the latch is designed to include both uniform stack height and transistors of uniform channel dimensions. This embodiment of the invention allows for minimum supply voltages of 60 millivolts; an improvement of over thirteen hundred percent compared with the typical prior art minimum voltage requirement of 800 millivolts.

As a result of these and other features discussed in more detail below, latches designed according to the principles of the present invention require significantly lower supply voltages and have significantly improved voltage scalability and performance compared to prior art latches.

As discussed above, prior art latch circuits required relatively large minimum supply voltages and therefore had poor voltage scalability, i.e., did not operate at a wide range of supply voltages. This was due, in large part, to a failure in the prior art to recognize all the factors contributing to the minimum voltage requirements of a device, such as a latch, and a corresponding failure to optimize, minimize or eliminate those factors.

According to the invention, the transistors making up the components of a latch are formed to have very low threshold voltages and use low voltage technology and methods, as opposed to the standard CMOS technology of the prior art. Consequently, the transistors included in the latches of the invention typically have threshold voltages of less than 300 millivolts and can operate with supply voltages of 300 millivolts or less. For a more detailed discussion of low power technology, and low threshold devices, see Applicant's related Patents listed below, which are incorporated by reference, in their entirety, herein for all purposes.

Lowering the threshold voltage of a transistor typically permits the same performance to be achieved at a lower supply voltage, thereby increasing voltage scalability of both the transistor and the device employing the transistor. However, lowering the threshold voltage of a transistor normally increases transistor leakage current. Consequently, devices having low threshold voltages can leak so much current when their circuits are in a sleep or standby mode, or between switching events, that the gains made by lowering the threshold voltage are outweighed by the large leakage current and its associated problems.

In particular, it was found during the research leading up to the present invention that when low threshold voltage transistors were used in a latch, the large current leakage of the transistors making up the components of the latch made it impossible for the latch to perform its primary function of data storage and state retention.

Figure 1A:
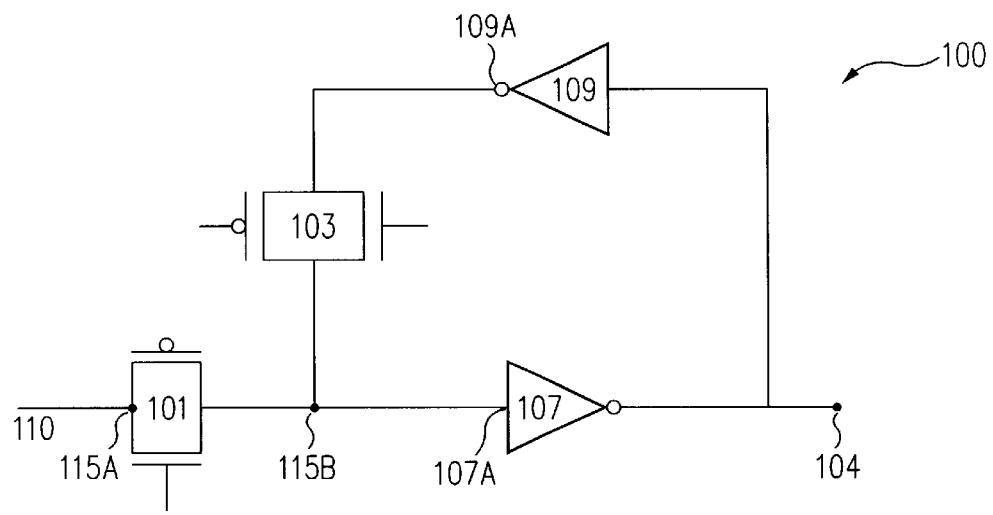
FIG. 1A is a schematic representation of one embodiment latch circuit in accordance with the invention.

FIG. 1A is a schematic representation of a latch 100, according to one embodiment of the invention, including; input line 110; first node 115A; first pass gate 101; second node 115B; first inverter 107; second inverter 109; feedback pass gate 103 and output 104.

As seen in FIG. 1A, in order for latch 100 to perform its function of data storage and maintaining state, it is critical that the value at second node 115B remain relatively constant, i.e., a digital high or low, regardless of the value at first node 115A, or any change in the value at first node 115A. As discussed above, it was found that simply making the components, i.e., first pass gate 101, first inverter 107, second inverter 109, and feedback pass gate 103, low voltage components, by building them from low threshold transistors, resulted in an inability of latch 100 to store data. This was because the leakage current of the components, and first pass gate 101 in particular, was too high. As a result, the value at second node 115B would quickly level off with the value at first node 115A due to leakage current and the latch would fail to perform its primary function. However, according to one embodiment of the invention, the value at second node 115B is maintained by increasing the channel width of the transistors in inverter 109 to increase the amplitude of the signal (not shown) from output 109A of inverter 109.

Therefore, according to one embodiment of the invention, first pass gate 101 and first inverter 107 include low threshold transistors of a first type that have a first channel width and inverter 109 includes low threshold transistors of a second type that have a second channel width that is larger that the first channel width. In other words, according to this embodiment of the invention the feedback components of the latch typically include large channel width transistors while the storage elements include smaller channel width transistors.

Figure 1B:
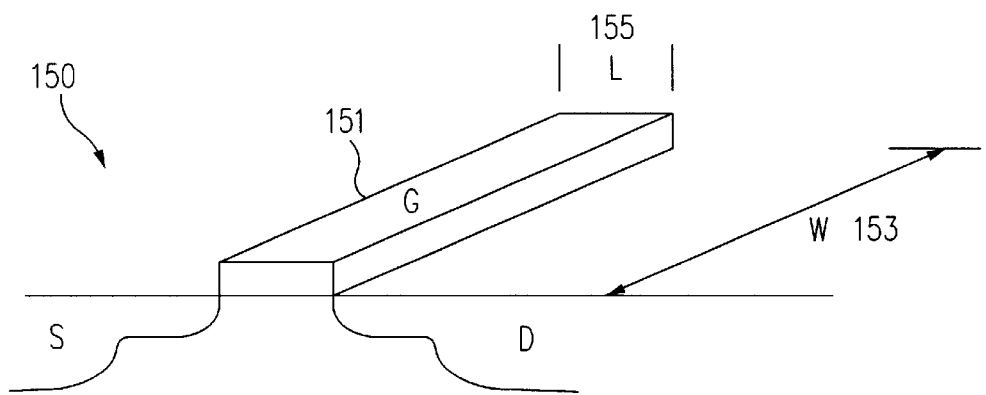
FIG. 1B shows an angled side view of a transistor including a channel.
Figure 1C:
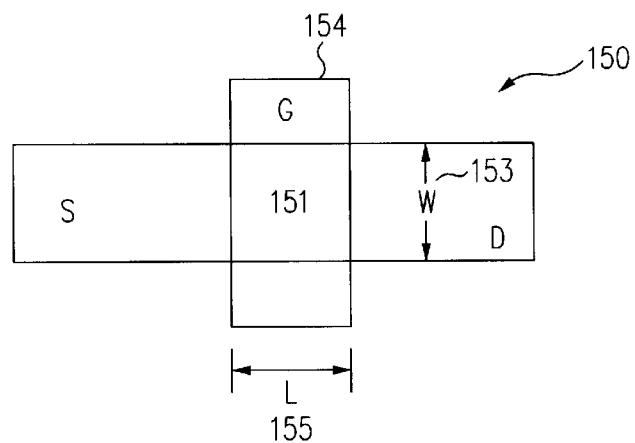
FIG. 1C shows an overhead view of a transistor including a channel.

FIG. 1B shows an angled side view of a transistor 150 including a channel 151, having a channel width 153 and a channel length 155. FIG. 1C shows an overhead view of transistor 150 including channel 151, channel width 153 and channel length 155.

According to one embodiment of the invention, the channel width 153 of the transistors in inverter 109 is on the order of double or more the channel width 153 of the transistors in inverter 107. Providing inverter 109 with transistors 150 having larger channel widths 153 allows for amplification of the feedback signal and therefore ensures latch 100 functions properly.

As discussed above, prior art latches typically had minimum supply voltage requirements of 800 millivolts or more. In contrast, latches designed according to this embodiment of the invention, such as latch 100, that use low threshold transistors with wider channel transistors in the feedback components than in the storage components, have minimum supply voltages in the 120, millivolts range. Thus, the latches of this embodiment of the invention represent over a six hundred percent decrease in minimum supply voltage requirements and therefore a significant increase in voltage scalability.

While latch 100 represented a significant improvement in voltage scalability over the prior art, the pursuit of even lower supply voltages, and even greater voltage scalability, lead the inventor of the present invention to seek further improvements and refinements. FIG. 2A is a schematic representation of one embodiment of a latch 200 in accordance with the principles of the present invention. As seen in FIG. 2A, latch 200 includes: input line 210; first node 215A; first pass gate 201; second node 215B; first inverter 207; feedback pass gate 203; third node 215C and output 204. Latch 200 also includes feedback stage 217 including second and third inverters 209A and 209B. Feedback stage 217 is included in latch 200, in place of second inverter 109 of latch 100 (FIG. 1A), to provide an output signal at third node 215C (FIG. 2A) of sufficient amplitude to hold the value, digital high or low, at second node 215B relatively constant regardless of the value, or change in value, on first node 215A so that latch 200 can properly perform its primary function of data storage.

Recall that with the embodiment of the invention shown in FIG. 1A, i.e., latch 100, the output signal (not shown) of inverter 109 (FIG. 1A) was made of sufficient amplitude to overcome current leakage by including transistors (not shown) in inverter 109 that had channel widths significantly larger than, and often at least double, the channel width of the transistors of inverter 107. In contrast, in the embodiment of the invention shown in FIG. 2A, inverters 209A and 209B are comprised of transistors having the same channel length and width as all other transistors in latch 200. However, by employing two inverters 209A and 209B in feedback stage 217, the effective channel width of feedback stage 217 is twice that of inverter 207 and the signal at third node 215C has sufficient amplitude to overcome current leakage and hold the value at second node 215B. Consequently, according to this embodiment of the invention, proper operation of latch 200 is ensured without resorting to the use of wider channel transistors.

As noted above, with latch 100 of the invention, the channel width 153 (FIGS. 1B and 1C) of the transistors in inverter 109 (FIG. 1A) was often on the order of double or more the channel width 153 of the transistors in inverter 107. Using the method and structure of the invention shown in FIG. 2A, any whole multiple of effective channel width can be achieved by simply adding more inverters to feedback stage 217.

It has been found that by employing feedback stage 217, with multiple inverters 209A and 209B, each having transistors of the same channel length and width, and by using only transistors of the same channel length and width in latch 200, the minimum functional supply voltage of latch 200 is reduced significantly over that of latch 100. Recall that prior art latches typically required at least 800 millivolts supply voltage and that latch 100 (FIG. 1A) of the invention required around 120 millivolts supply voltage. Latch 200, with uniform transistor channel dimensions, according to this embodiment of the invention, requires a minimum supply voltage of on the order of 85 millivolts, over a nine hundred percent improvement over the prior art and almost a fifty percent improvement over latch 100.

The theoretical reasons for this improved performance are discussed below. However, the inventor does not wish to be bound by theory, nor does the explanation below serve to limit the scope of the invention. According to the invention, it is postulated that to minimize the supply voltage a device, such as a latch, requires, one must optimize the ratio of the "on-current" ($I_{on}$) to the "off-current" ($I_{off}$) for the device. The $I_{on}/I_{off}$ ratio for the device is controlled, in turn, by the $I_{on}/I_{off}$ ratio of the worst performing component, such as an inverter, making up the device. Therefore, the $I_{on}/I_{off}$ ratio for each component in the device must also be optimized. The $I_{on}/I_{off}$ ratio for each component in the device is, in turn, controlled by the operational $I_{on}/I_{off}$ ratio of the worst performing transistor making up the component in the device. Therefore, the $I_{on}/I_{off}$ ratio for each transistor in the device must also be optimized.

In the following discussion, $I_{on}$ is defined as the current through the device when the voltage between the gate of the transistor and the source of the transistor ($V_{gs}$) and the voltage between the drain of the transistor and the source of the transistor ($V_{ds}$) are both the voltage of a logical one. On the other hand, $I_{off}$ is defined as the current through the device when: the voltage between the gate of the transistor and the source of the transistor ($V_{gs}$) is the voltage of a logical zero; and the voltage between the drain of the transistor and the source of the transistor ($V_{ds}$) is the voltage of a logical one.

$I_{off}$ is more dependent and affected by the threshold voltage of the transistor than $I_{on}$. Consequently, to optimize the ratio $I_{on}/I_{off}$ and thereby reduce the supply voltage required by the device, it is critical to minimize the variations in the threshold voltage of the transistors comprising the device.

There are a number of factors that contribute to the variation of a device's threshold voltage. For example, to set a device's threshold voltage near zero, light doping and/or counter doping in the channel of the device may be provided. However, due to processing variations, the exact dopant concentration in the channel can vary slightly from device to device. Although these variations may be slight, they can shift a device's threshold voltage by a few tens or even hundreds of millivolts. Further, dimensional variations, such as channel width and channel length, and environmental factors, such as operating temperature fluctuations, can shift the threshold voltage.

Figure 2B:
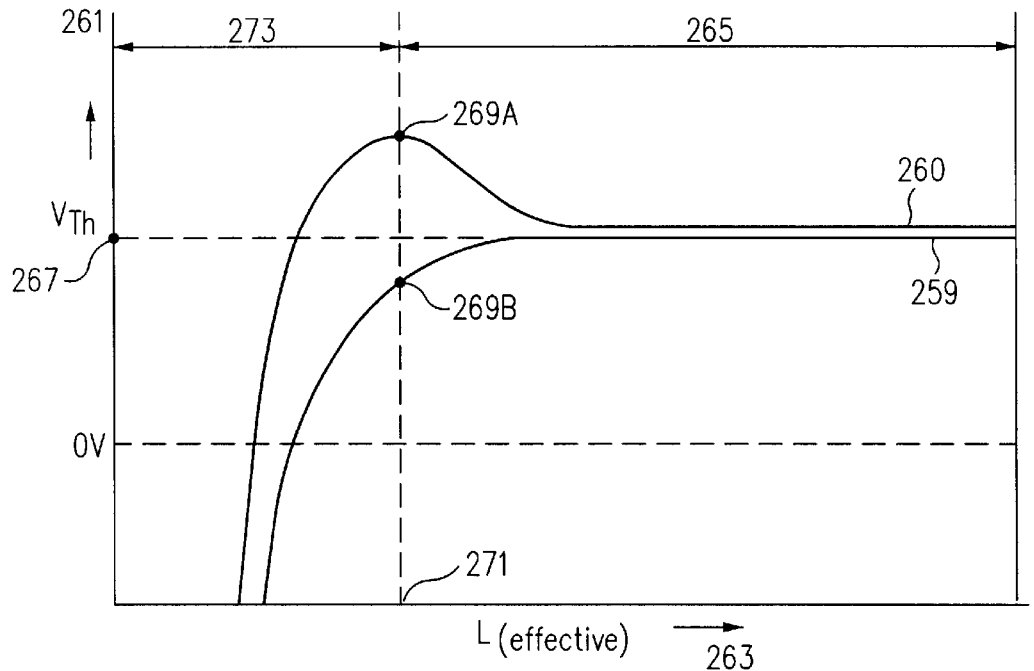
FIG. 2B is a graph of threshold voltage (vth) versus effective length (L) of a transistor that illustrates the threshold voltage "roll-off" effect.

As noted above, the threshold voltage of a transistor, such as transistor 100 in FIGS. 1B and 1C, varies with the effective length, such as length 155 in FIGS. 1B and 1C, of the channel, such as channel 151 in FIGS. 1B and 1C. FIG. 2B is a graph of threshold voltage ($V_{th}$) versus effective length (L) of a transistor that illustrates the threshold voltage "roll-off" effect. FIG. 2B shows a curve 259 that is the plot of threshold voltage ($V_{th}$) on vertical axis 261 versus effective length (L) of a transistor with uniform lateral channel doping on the horizontal axis 263. FIG. 2B also shows a curve 260 that is the plot of threshold voltage ($V_{th}$) on vertical axis 261 versus effective length (L) of a transistor with halo channel doping on the horizontal axis 263. As shown in FIG. 2B, throughout region 265 of curves 259 and 260, the threshold voltage of the transistor remains relatively stable, and on curve 259, remains at approximately value 267. However, at point 269A on curve 260, and at point 269B on curve 259, i.e., where the effective length is equal to the "roll-off value" 271 on horizontal axis 263, the threshold voltage decreases rapidly and continues to decrease rapidly throughout region 273 of curves 259 and 260 until it drops below zero as the effective length continues to approach zero. The sudden decrease and instability of the threshold voltage in region 273 is known as the "roll-off effect".

Since, as discussed above, according to the invention, it is critical to have consistent threshold voltages to optimize the ratio $I_{on}/I_{off}$ in the device, it is equally critical that the transistors have equal channel lengths. In addition, as shown graphically in FIG. 2B, it is particularly critical that the channel lengths be equal when the channel lengths are in region 273 of curves 259 and 260, i.e., below the roll-off value 271.

Figure 2C:
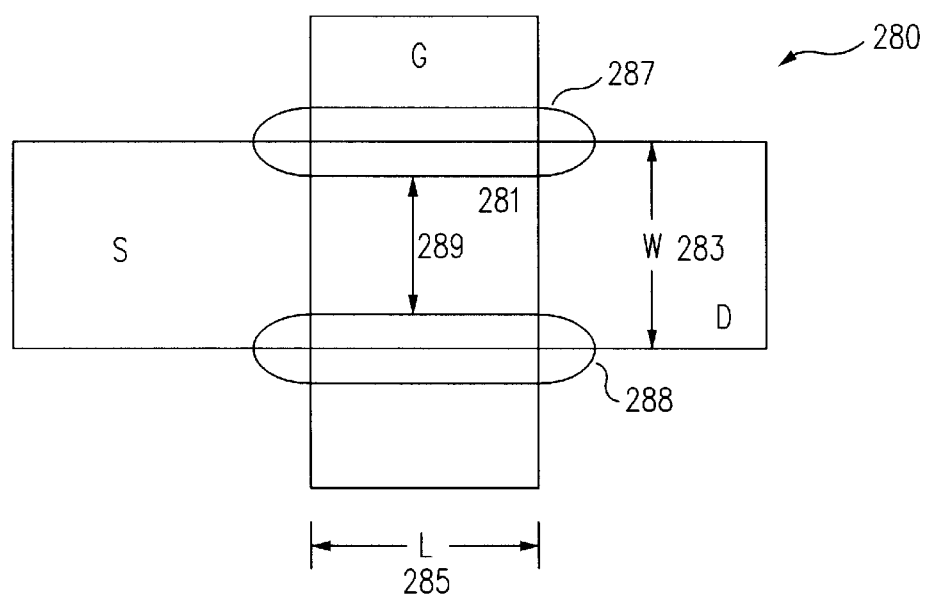
FIG. 2C shows an overhead view of the edge effect regions of a relatively large channel width transistor.

The roll-off effect shown graphically in FIG. 2B is well known in the art, as is the fact that the threshold voltage of a transistor is dependent on channel length. It was also known in the prior art that channel width also affected threshold voltage. However, in the prior art the effects of the channel width on threshold voltage were considered negligible. However, and in contrast to the prior art, when operating at low voltage with transistors having very low threshold voltages, channel width plays a very significant role in the consistency of the threshold voltage of a transistor. FIG. 2C shows an overhead view of a transistor 280 with a channel 281 having a channel length 285 and relatively wide channel width 283. Also shown in FIG. 2C are regions 287 and 288 at the edges of the channel 281 where the threshold voltage varies, i.e., is higher (or lower), due to edge effects. As seen in FIG. 2C, a transistor having a relatively wide channel width 283, such as transistor 280, has a significant distance 289 between edge effect regions 287 and 288. Consequently, the edge effects in transistor 280 are relatively minor and do not significantly affect the value or the consistency of the threshold voltage of transistor 280.

Figure 2D:
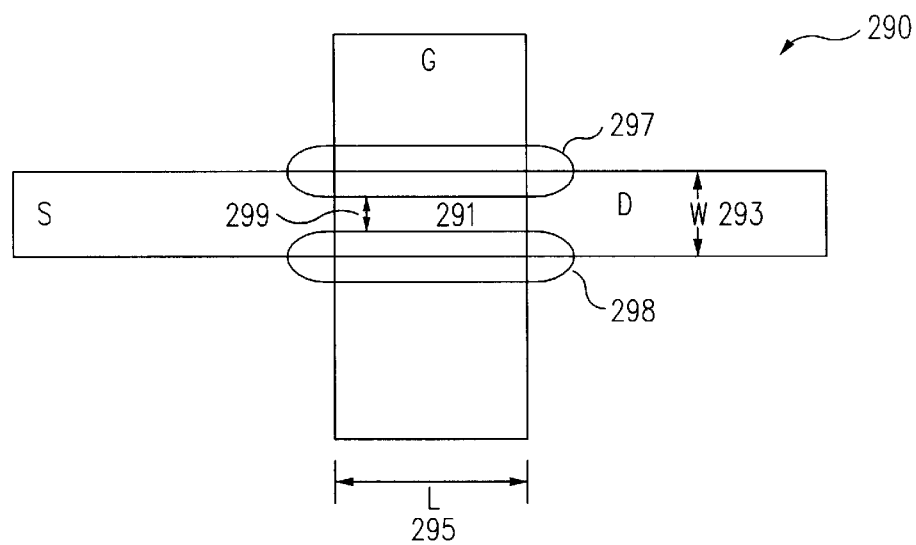
FIG. 2D shows an overhead view of the edge effect regions of a relatively small channel width transistor.

In contrast to FIG. 2C, FIG. 2D shows an overhead view of a transistor 290 with a channel 291 having a channel length 295 and relatively narrow channel width 293. Also shown in FIG. 2D are regions 297 and 298 where the threshold voltage varies due to edge effects. As seen in FIG. 2D, a transistor having a relatively narrow channel width 293, such as transistor 290, has only a small distance 299 between edge effect regions 297 and 298. Consequently, the edge effects are significant and dominate the value and the consistency of the threshold voltage of transistor 290.

Since, according to the invention, it is critical to have consistent threshold voltages to optimize the ratio $I_{on}/I_{off}$ in the device, it is equally critical that the transistors have equal channel widths. Otherwise, transistors 290 with narrower channel widths 293 will be more affected by edge effects and will typically have higher (or lower) threshold voltages while have transistors 280 with narrower channel widths 283 will be less effected by edge effects and will typically have lower (or higher) threshold voltages. Further, in low power circuits it is advantageous to minimize channel width to reduce gate capacitance. As discussed above, minimizing channel widths tends to amplify variations in threshold voltage due to the dominance of edge effects in narrower channel width devices. Consequently, maintaining a uniform channel width in such low power circuits is critical.

Figure 3:
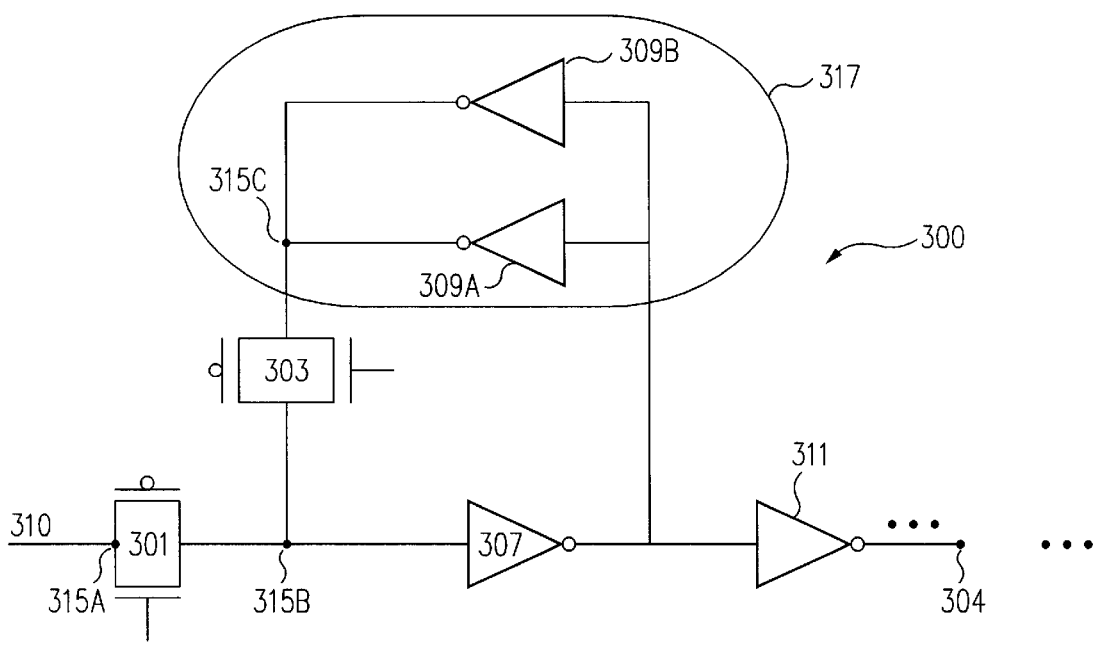
FIG. 3 is a schematic representation of another embodiment of a latch circuit in accordance with the principles of the present invention.

FIG. 3 is a schematic representation of another embodiment of a latch 300 in accordance with the principles of the present invention. As seen in FIG. 3, latch 300 includes: input line 310; first pass gate 301; first node 315A; second node 315B; first inverter 307; third node 315C; feedback pass gate 303 and output 304.

Latch 300 also includes feedback stage 317 including second and third inverters 309A and 309B. Feedback stage 317, like feedback stage 217 in latch 200 discussed above, is included in latch 300, in place of second inverter 109 of prior art latch 100 (FIG. 1A), to provide an output signal at third node 315C (FIG.3) of sufficient amplitude to hold the value at second node 315B, regardless of the value at first node 315A.

Latch 300 is almost identical to latch 200 discussed above, and therefore includes all the advantages over prior art latches discussed above. In particular, according to this embodiment of the invention, inverters 309A and 309B are comprised of transistors having the same channel length and width as all other transistors in latch 300. However, by employing two inverters 309A and 309B in feedback stage 317, the effective channel width of feedback stage 317 is twice that of inverter 307 and the signal at third node 315C has sufficient amplitude for latch 300 to perform its primary function of data storage. Consequently, the output signal at third node 315C is kept at sufficient amplitude for proper latch 300 operation without resorting to the use of wider channel transistors.

In addition, latch 300 includes fourth inverter 311. The purpose of fourth inverter 311 is to electrically isolate latch 300 from follow on or "slave" latches (not shown) and to keep down stream latches from competing with inverter 307 and thereby interfering with the proper operation of latch 300.

As discussed above, a first method and structure of the invention involves using low threshold transistors to form the components of a latch and providing the feedback components of the latch with wider channel low threshold transistors while providing the storage components of the latch with narrower channel transistors. Using this structure and method of the invention, the minimum supply voltage required by the latch is six fold less than that of prior art latches.

As also discussed above, according to another embodiment of the invention, to minimize the supply voltage required by a latch, and thereby maximize the voltage scalability of the latch, it is critical to optimize the ratio $I_{on}/I_{off}$. To optimize the ratio $I_{on}/I_{off}$ it is critical to minimize the variations in the threshold voltage of the transistors comprising the device. According to this embodiment of the invention, to have consistent threshold voltages, it is critical that every transistor in the latch have channel dimensions, i.e., length and width that are as consistent as possible. Otherwise, the transistors with shorter channel lengths will have different threshold voltages than the transistors with longer channel lengths due to the "roll-off" effect and the transistors with wider channels will have different threshold voltages than the transistors with narrower channels due to the dominance of edge effects in transistors with narrower channels.

Consequently, according to some embodiments of the invention, all the transistors included in latches 200 and 300 have the same channel dimensions, i.e., the same channel length and width. In order to meet this requirement and still provide a feedback signal of sufficient strength, latches 200 and 300 include feedback stages 217 and 317, with multiple inverters 209A, 209B and 309A, 309B, respectively. By using only transistors of the same channel length and width in latches 200 and 300, the minimum supply voltage of latches 200 and 300 is reduced even further over that of the prior art.

In addition to ensuring all of the transistors making up a latch have the same channel dimensions, another way to minimize the required supply voltage of latches, according to another embodiment of the invention, is to design the latches with uniform stack height components, i.e., with components having equal numbers of transistors in series. This technique is in sharp contrast to the prior art teachings.

Figure 4:
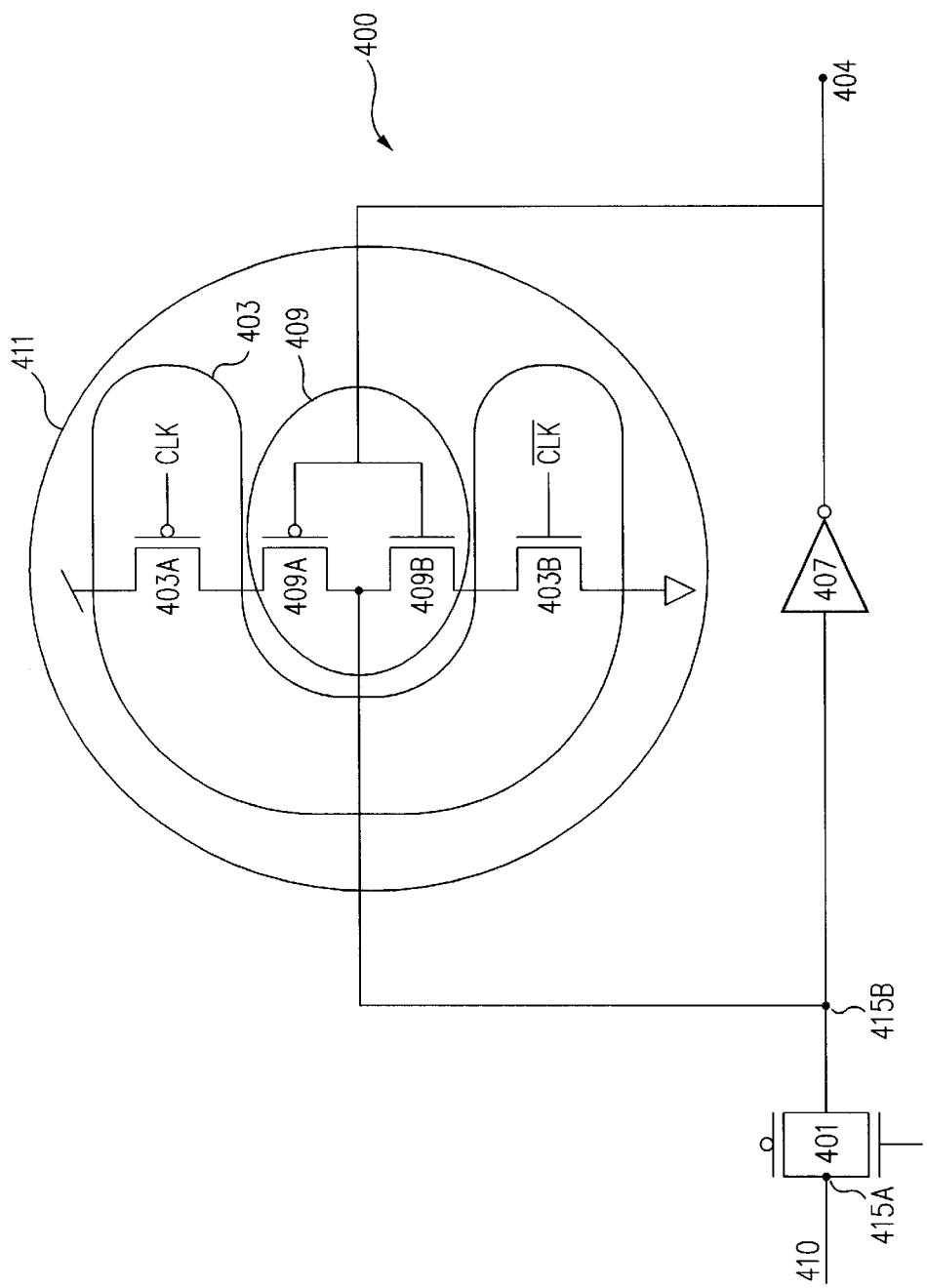
FIG. 4 is a schematic representation of a prior art latch circuit.

FIG. 4 is a schematic representation of prior art latch 400. FIG. 4 includes a detailed representation of prior art feedback sub-system 411. As shown in FIG. 4, in the prior art, transistors 403A and 403B made up a pass gate 403 and transistors 409A and 409B made up an inverter 409. As also shown in FIG. 4, in the prior art, it was taught that transistors 403A and 403B making up pass gate 403 should be separated, in series, by transistors 409A and 409B of inverter 409. Consequently, pass gate 403 had a stack height of one while pass gate 409 had a stack height of two. Therefore, in the prior art, it was taught to design latches with non-uniform stack heights. This was taught in part to save layout area, reduce capacitance, and to simplify manufacture of prior art latch 400. In addition, in the prior art it was thought that the design of prior art latch 400 could also reduce power consumption and improve performance. However, as is discussed in more detail below, the latter part of this prior art teaching proved incorrect in low supply voltage/low threshold systems.

Figure 5A:
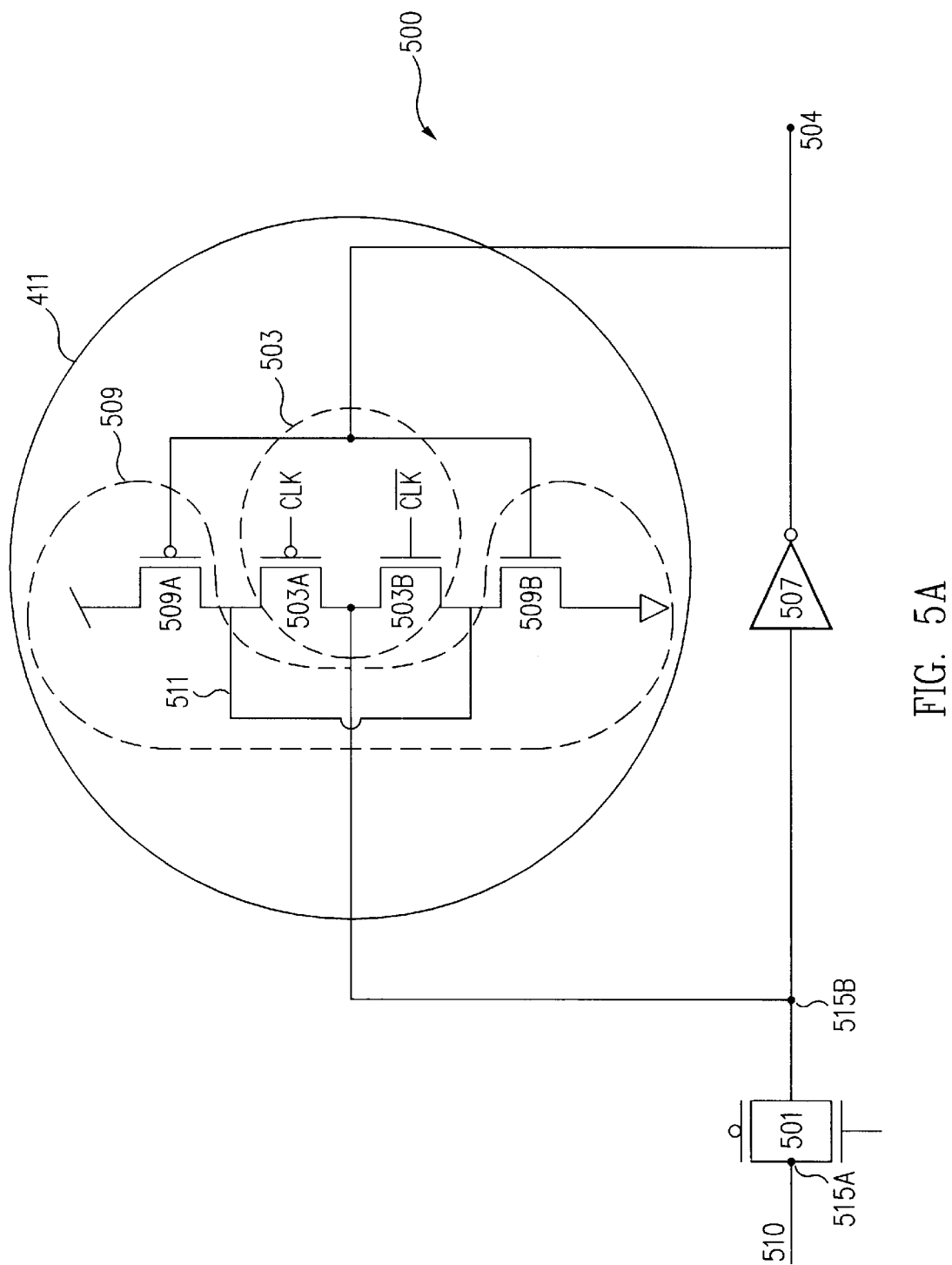
FIG. 5A is a schematic representation of a latch circuit including uniform stack height in accordance with the principles of one embodiment of the present invention.

FIG. 5A is a schematic representation of a latch 500 including uniform stack height components in accordance with the principles of one embodiment of the present invention. As seen in FIG. 5A, according to the invention, an inverter 509 is made up of transistors 509A and 509B. It is important to note that, according to the invention, and in contrast to the teachings of the prior art, the drain of transistor 509A is coupled to the drain of transistor 509B by line 511.

Consequently, inverter 509 has a stack height of one. In addition, latch 500 includes a feedback pass gate 503 made up of transistors 503A and 503B. According to the invention, and in contrast to the teachings of the prior art, feedback pass gate 503 is positioned between transistors 509A and 509B and feedback pass gate 503 also has a stack height of one.

As discussed above, using the method and structure of this embodiment of the invention, the components of latch 500 have a uniform stack height of one. This is a deliberate design and feature of the invention that is in direct contrast to the teachings of the prior art, as shown in FIG. 4, that, for ease of production and to minimize cost, taught to exclude line 511. Extensive research and experimentation with low voltage latches was performed by the inventor of the present invention. During this experimentation, it was unexpectedly discovered that by breaking with the traditions and teachings of the prior art, and designing a latch with uniform stack height, as shown in FIG. 5A, the performance of the latch was significantly increased and the minimum required supply voltage significantly reduced. The fact that uniform stack height had such a large effect on voltage scalability was an unexpected result of the structure and method of the present invention. It is believed that this positive result is due to the fact that the effective threshold voltage of a transistor depends on whether its source is connected to ground or the drain of another transistor. In the latter case, the body effect on all but the bottom transistor in the stack increases the threshold voltage of the stack. If a circuit contains stacks of different heights, each stack will have a different threshold voltage.

Consequently, this source of threshold voltage variations can, according to the invention, be minimized by requiring that all the stacks have the same height.

Figure 5B:
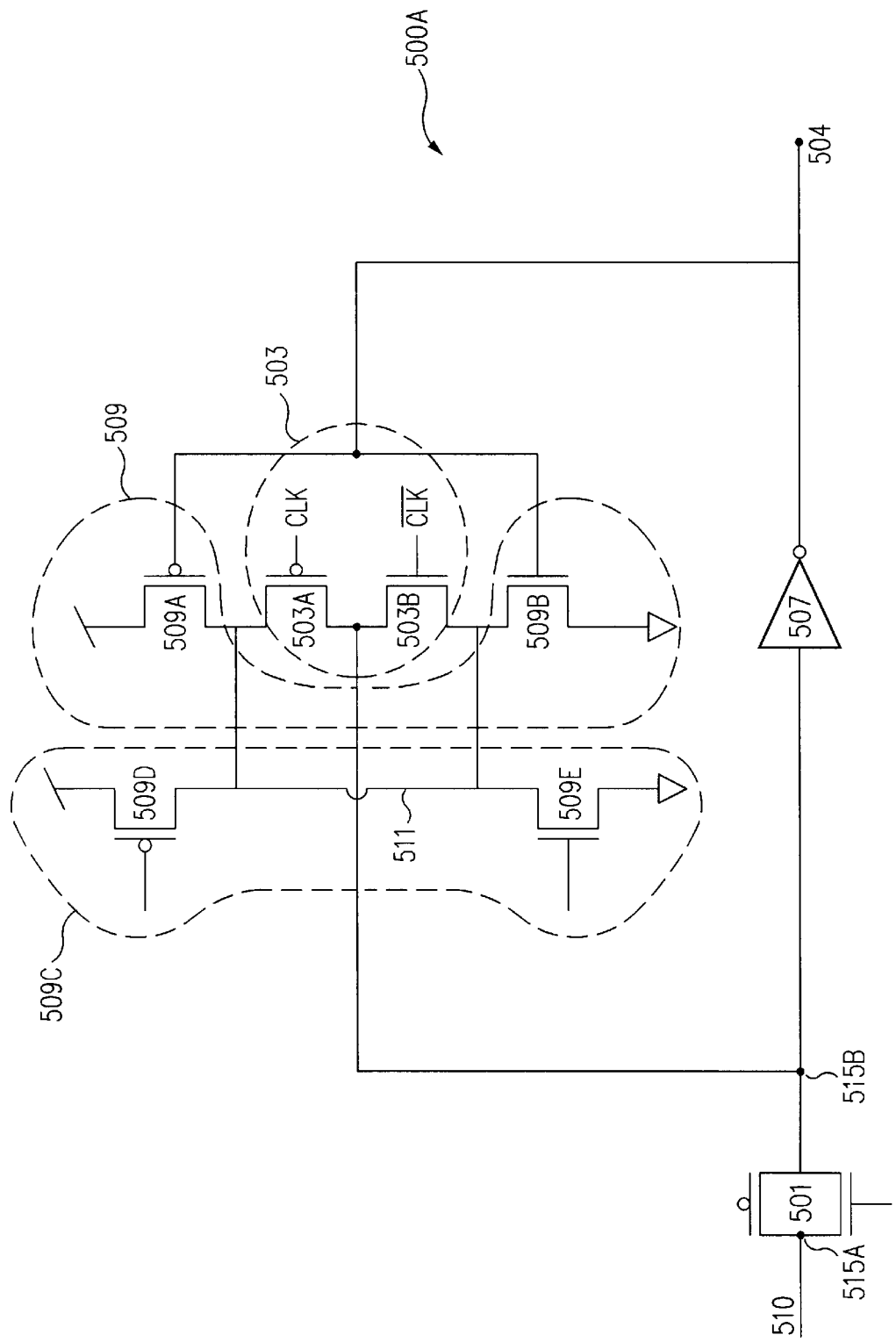
FIG. 5B is a schematic representation of a latch circuit including uniform stack height in accordance with the principles of another embodiment of the present invention.

A particularly significant increase in latch performance is obtained when, according to one embodiment of the invention, the latch is designed to include both uniform stack height and transistors of uniform channel dimensions as discussed above. FIG. 5B is a schematic representation of a latch 500A including uniform stack height and uniform transistor channel dimensions in accordance with the principles of one embodiment of the present invention.

As seen in FIG. 5B, according to the invention, a first inverter 509 is made up of transistors 509A and 509B. It is important to note that, according to the invention, and in contrast to the teachings of the prior art, the drain of transistor 509A is coupled to the drain of transistor 509B by line 511. Consequently, inverter 509 has a stack height of one. In addition, latch 500 includes a feedback pass gate 503 made up of transistors 503A and 503B. According to the invention, and in contrast to the teachings of the prior art, feedback pass gate 503 is positioned between transistors 509A and 509B and therefore feedback pass gate 503 has a stack height of one.

Latch 500A also includes a second inverter 509C made up of transistors 509D and 509E. It is important to note that, according to the invention, and in contrast to the teachings of the prior art, the drain of transistor 509D is coupled to the drain of transistor 509E by line 511. Consequently, inverter 509C, like inverter 509A and feedback pass gate 503, has a stack height of one.

As discussed above, using the method and structure of the invention, the components of latch 500A have a uniform stack height of one. This is a deliberate design and feature of the invention that is in direct contrast to the teachings of the prior art that, for ease of production and to minimize cost, taught not to include line 511 to couple the drain of transistor 509A to the drain of transistor 509B and the drain of transistor 509D to the drain of transistor 509E. As discussed above, extensive research and experimentation with low voltage latches was performed by the inventor of the present invention. During this experimentation, it was unexpectedly discovered that by breaking with the traditions and teachings of the prior art and designing a latch with uniform stack heights, as shown in FIG. 5B, the performance of the latch could be significantly increased and the minimum required supply voltage significantly reduced. This was an unexpected result of the structure and method of the present invention. As a specific example, it was discovered that minimum supply voltages of latches with uniform stack heights, such as latch 500 in FIG. 5A, is on the order of 60 millivolts, a decrease in minimum supply voltage of over thirteen fold compared with the prior art.

As discussed above, one embodiment of the invention includes a latch with components that are comprised of low threshold transistors. To overcome the effects of leakage current, and ensure proper latch function, according to this embodiment of the invention, the channel widths of the low threshold transistors making up the feedback components of the latch are larger than the channel widths of the low threshold transistors making up the storage components of the latch. This embodiment of the invention allows for minimum supply voltages of 120 millivolts; an improvement of over six hundred percent compared with the prior art minimum voltage requirement of 800 millivolts.

In another embodiment of the present invention, a method and structure for providing low voltage latches includes low threshold transistors having consistent channel dimensions, i.e., consistent channel length and width, and the use of multi-inverter feedback structures. This embodiment of the invention allows for minimum supply voltages of 85 millivolts; an improvement of over nine hundred percent compared with the prior art minimum voltage requirement of 800 millivolts.

In another embodiment of the present invention, a method and structure for providing low voltage latches includes low threshold transistors having consistent channel dimensions and latch components of uniform stack height. This embodiment of the invention allows for minimum supply voltages of 60 millivolts; an improvement of over thirteen hundred percent compared with the prior art minimum voltage requirement of 800 millivolts.

As a result of these and other features discussed in more detail above, latches designed according to the principles of the present invention require significantly lower supply voltages and have significantly improved voltage scalability and performance compared to prior art latches. Consequently, latches designed according to the principles of the invention can better meet the needs of modern electronics markets than prior art methods or structures.

This Application is related to: U.S. Pat. No. 5,773,863 entitled "Low Power, High Performance Junction Transistor"; U.S. Pat. No. 5,780,912 entitled "Asymmetric Low Power MOS Devices"; U.S. Pat. No. 5,622,880 entitled "Method of Making a Low Power, High Performance Junction Transistor"; U.S. Pat. No. 5,753,958 entitled "Back-Biasing in Asymmetric MOS Devices"; U.S. Pat. No. 5,650,340 entitled "Method for Making Asymmetric Low Power Devices"; U.S. Pat. No. 5,719,422, entitled "Low Threshold Voltage, High Performance Junction Transistor"; U.S. Pat. No. 6,137,142 entitled "MOS Device Structure and Method for Reducing PN Junction Leakage"; U.S. Pat. No. 6,110,783 entitled "Method for Forming a Notched Gate Oxide Asymmetric MOS Device"; U.S. Pat. No. 6,121,666 entitled "Split Gate Oxide Asymmetric MOS Device"; U.S. Pat. No. 6,093,951 entitled "MOS Devices With Retrograde Pocket Regions"; U.S. Pat. No. 5,985,727 entitled "Method for Forming MOS Devices with Retrograde Pocket Regions and Counter Dopant Regions Buried in the Substrate Surface"; U.S. Pat. No. 5,923,987 entitled "Method for Forming MOS Devices with Retrograde Pocket Regions and Counter Dopant Regions Buried in the Substrate Surface"; U.S. Pat. No. 5,942,781 entitled "Tunable Threshold SOI Device Using Back Gate Well"; U.S. Pat. No. 6,100,567 entitled "Tunable Threshold SOI Device Using Back Gate and Intrinsic Channel Region"; U.S. Pat. No. 6,072,217 entitled "Tunable Threshold Device Using Isolated Well Structure for Back Gate"; U.S. Pat. No. 6,048,746 entitled "Methods for Making Die-Compensated Threshold Tuning Circuit"; U.S. Pat. No. 6,087,892 entitled "Target Ion/Ioff Threshold Tuning Circuit and Method"; U.S. Pat. No. 5,998,850 entitled "Tunable Field Plate"; U.S. Pat. No. 6,091,283 entitled "Sub-Threshold Leakage Tuning Circuit"; U.S. Pat. No. 5,471,421 entitled "Storage Cell Using Low Powered/Low Threshold CMOS Pass gates Having Reduced Charge Leakage"; U.S. Pat. No. 5,581,500 entitled "Memory Cell with Power Supply Induced Reversed-Bias Pass gates for Reducing Off-Leakage Current"; U.S. Pat. No. 5,566,120 entitled "Apparatus and Method for Controlling Transistor Current Leakage"; U.S. Pat. No. 6,606,270 entitled "Dynamic Clocked Inverter Latch with Reduced Charge Leakage"; U.S. Pat. No. 5,612,645 entitled "Dynamic MOSFET Threshold Voltage Controller"; U.S. Pat. No. 5,640,115 entitled "Self-Enabling Latch"; and U.S. patent application Ser. No. 09/030,030, now allowed, entitled "Back biased MOS Device and Method"; Co-filed U.S. patent application Ser. No. 08/671,399, entitled "Low Voltage Latch with Uniform Sizing", of James Burr; Co-filed U.S. patent application Ser. No. 80/253 007 entitled "Low Voltage Latch with Uniform Stack Height", of James Burr, all of which are assigned to the assignee of the present invention and are incorporated herein, in their entirety, by reference for all purposes.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, in the discussion above, an individual latch, or latch stage, was illustrated and discussed. However, those of skill in the art will readily recognize that it is fully intended that individual latches could be linked into data latching systems, arrays or chains and that the principles of the invention apply to these systems as well. Indeed, the improved performance associated with the method and structure of the invention is simply multiplied with each latch, or latch stage, added.

Therefore, the scope of the invention is defined by the claims and their equivalents.

What is claimed is:

1. A latch, said latch comprising:

an input line;

a first node coupled to said input line;

a first pass gate coupled to said first node;

a second node coupled to said first pass gate such that said first pass gate is coupled between said first node and said second node;

a first inverter having an input coupled to said second node, said first inverter comprising transistors, said first inverter having an output;

a feedback stage having an input node coupled to said output of said first inverter and an output node coupled to said second node, said feedback stage comprising:

a first transistor comprising a first flow electrode, a second flow electrode and a control electrode, said first transistor control electrode being coupled to said feedback stage input node;

a second transistor comprising a first flow electrode, a second flow electrode and a control electrode, said second transistor control electrode being coupled to said feedback stage input node and said first transistor control electrode, said second transistor first flow electrode being coupled to said second flow electrode of said first transistor;

a third transistor comprising a first flow electrode, a second flow electrode and a control electrode, said third transistor second flow electrode being coupled to said first transistor second flow electrode and said second transistor first flow electrodes;

a fourth transistor comprising a first flow electrode, a second flow electrode and a control electrode, said fourth transistor first flow electrode being couple to said first transistor second flow electrode said second transistor first flow, electrode and said third transistor second flow electrode
a feedback pass gate coupled between said first transistor second flow electrode and said second transistor first flow electrode; wherein
   each of said transistors of said first inverter and said first, second, third and fourth transistors of said feedback stage has approximately the same channel length and approximately the same channel width as all other transistors of said first inverter and said first, second, third and fourth transistors of said feedback stage, further wherein;
      a stack height of said transistors of said feedback stage is equal to a stack height of said transistors of said feedback pass gate; further wherein;
         said transistors of said first inverter and said first, second, third and fourth transistors of said feedback stage are low threshold transistors.

2. The latch of claim 1, wherein;
said transistors of said first inverter and said first, second, third and fourth transistors of said feedback stage are low threshold transistors having unbiased threshold voltages of less than 300 millivolts.

3. The latch of claim 1, wherein;
a supply voltage supplied to said latch is less than 300 millivolts.

4. A latch, said latch comprising:
an input line;
a first node coupled to said input line;
a first pass gate coupled to said first node;
a second node coupled to said first pass gate such that said first pass gate is coupled between said first node and said second node;
a first inverter having an input coupled to said second node, said first inverter comprising transistors, said first inverter having an output;
a feedback-stage having an input node coupled to said output of said first inverter and an output node coupled to said second node, said feedback stage comprising:
   a first transistor comprising a first flow electrode, a second flow electrode and a control electrode, said first transistor control electrode being coupled to said feedback stage input node;
   a second transistor comprising a first flow electrode, a second flow electrode and a control electrode, said second transistor control electrode being coupled to said feedback stage input node and said first transistor control electrode, said second transistor first flow electrode being coupled to said second flow electrode of said first transistor;
   a third transistor comprising a first flow electrode, a second flow electrode and a control electrode, said third transistor second flow electrode being coupled to said first transistor second flow electrode and said second transistor first flow electrode;
   a fourth transistor comprising a first flow electrode, a second flow electrode and a control electrode, said fourth transistor first flow electrode being coupled to said first transistor second flown electrode, said second transistor first flow electrode;
and said third transistor second flow electrode; and said third transistor second flow electrode;
a feedback pass gate coupled between said first transistor second flow electrode and said second transistor first flow electrode; wherein
   each of said transistors of said first inverter and said first, second, third and fourth transistors of said feedback stage has approximately the same channel length and approximately the same channel width as all other transistors of said first inverter and said first, second, third and fourth transistors of said feedback stage, further wherein;
      a stack height of said transistors of said feedback stage is equal to a stack height of said transistors of said feedback pass gate; further wherein;
         said transistors of said first inverter and said first, second, third and fourth transistors of said feedback stage are low threshold transistors having unbiased threshold voltages of less than 300 millivolts and a supply voltage supplied to said latch is less than said supply voltage of 300 millivolts.

5. A method of designing a latch, said method comprising:
providing an input line;
   coupling a first node to said input line;
   coupling a first pass gate to said first node;
   coupling said first pass gate to a second node such that said first pass gate is coupled between said first node and said second node;
   providing a first inverter having an input, said first inverter comprising transistors, said first inverter having an output;
   coupling said first inverter input to said second node;
   providing a feedback stage having an input node and an output node, said feedback stage comprising:
      a first transistor comprising a first flow electrode, a second flow electrode and a control electrode, said first transistor control electrode being coupled to said feedback stage input node;
      a second transistor comprising a first flow electrode, a second flow electrode and a control electrode, said second transistor control electrode being coupled to said feedback stage input node and said first transistor control electrode;
      a third transistor comprising a first flow electrode, a second flow electrode and a control electrode;
      a fourth transistor comprising a first flow electrode, a second flow electrode and a control electrode;
   coupling said first transistor second flow electrode to said second transistor first flow electrode said third transistor second flow electrode and said fourth transistor first flow electrode;
   coupling said input node of said feedback stage to said output of said first inverter;
   coupling said output node of said feedback stage to said second node; and
   coupling a feedback pass gate between said first transistor second flow electrode and said second transistor first flow electrode, wherein;
      each of said transistors of said first inverter and said first, second, third and fourth transistors of said feedback stage has approximately the same channel length and approximately the same channel width as all other transistors of said first inverter and said first, second, third and fourth transistors of said feedback stage, further wherein;
      a stack height of said transistors of said feedback stage is equal to a stack height of said transistors of said feedback pass gate; further wherein;
   said transistors of said first inverter and said first, second, third and fourth transistors of said feedback stage are low threshold transistors.

6. The method of claim 5, wherein;

said transistors of said first inverter and said. first, second, third and fourth transistors of said feedback stage are low threshold transistors having unbiased threshold voltages of less than 300 millivolts.

7. The method of claim 5, further comprising;

providing a supply voltage to said latch, said supply voltage being less than 300 millivolts.

8. A method of designing a latch, said method comprising:

providing an input line;
    coupling a first node to said input line;
    coupling a first pass gate to said first node;
    coupling said first pass gate to a second node such that said first pass gate is coupled between said first node and said second node;
    providing a first inverter having an input, said first inverter comprising transistors, said first inverter having an output;
    coupling said first inverter input to said second node;
    providing a feedback stage having an input node and an output node, said feedback stage comprising:
        a first transistor comprising a first flow electrode, a second flow electrode and a control electrode, said first transistor control electrode being coupled to said feedback stage input node;
        a second transistor comprising a first flow electrode, a second flow electrode and a control electrode, said second transistor control electrode being coupled to said feedback stage input node and said first transistor control electrode;
        a third transistor comprising a first flow electrode, a second flow electrode and a control electrode;
        a fourth transistor comprising a first flow electrode, a second flow electrode and a control electrode;
        coupling said first transistor second flow electrode to said second transistor first flow electrode said third transistor second flow electrode and said fourth transistor first flow electrode;
        coupling said input node of said feedback stage to said output of said first inverter;
        coupling said output node of said feedback stage to said second node;
        coupling a feedback pass gate between said first transistor second flow electrode and said second transistor first flow electrode; and
    providing a supply voltage to said latch, said supply voltage being less than 300 millivolts; wherein
        each of said transistors of said first inverter and said first, second, third and fourth transistors of said feedback stage has approximately the same channel length and approximately the same channel width as all other transistors of said first inverter and said first, second, third and fourth transistors of said feedback stage, further wherein;
        a stack height of said transistors of said feedback stage is equal to a stack height of said transistors of said feedback pass gate; further wherein;
said transistors of said first inverter and said first, second, third and fourth transistors of said feedback stage are low threshold transistors having unbiased threshold voltages of less than said supply voltage of 300 millivolts.

* * * * *